United States Patent [19]

Matsubara

[11] 3,953,619

[45] Apr. 27, 1976

[54] METHOD FOR IONIZATION ELECTROSTATIC PLATING

[75] Inventor: Kiyoshi Matsubara, Higashi-Murayama, Japan

[73] Assignee: Agency of Industrial Science & Technology, Tokyo, Japan

[22] Filed: Oct. 3, 1973

[21] Appl. No.: 403,060

[30] Foreign Application Priority Data
Oct. 3, 1972  Japan.............................. 47-99291

[52] U.S. Cl................................ 427/39; 204/164; 427/50
[51] Int. Cl.²........................................ B05D 3/06
[58] Field of Search.......... 117/93.1 GD, 93.3, 93.4, 117/106 R; 204/164; 427/38, 39, 50; 118/49.1, 49.5

[56] References Cited
UNITED STATES PATENTS

| | | | |
|---|---|---|---|
| 3,290,567 | 12/1966 | Gowen.............................. | 117/93.3 |
| 3,297,465 | 1/1967 | Connell et al.............. | 117/93.1 GD |
| 3,419,487 | 12/1968 | Robbins et al....................... | 427/39 |
| 3,492,152 | 1/1970 | Cariou et al........................ | 117/93.4 |
| 3,639,151 | 2/1972 | Krutenat................................ | 427/39 |

OTHER PUBLICATIONS

Chambers et al. "Research/Development" May 1971 pp. 32–35.

*Primary Examiner*—John H. Newsome
*Attorney, Agent, or Firm*—Kurt Kelman

[57] ABSTRACT

In ionization electrostatic plating, a cathode is incorporated separately of the article subjected to plating which has conventionally been adapted to function as makeshift cathode. The electric circuit to said article is designed to permit flow of electric current which is wholly consumed for heating the article to a temperature required for plating, so that the article will no longer play the main part of a cathode for glow discharge.

This method prevents the film of plating material deposited on the article from breaking, heightens the plating efficiency and, consequently, provides highly desirable plating of metal and also non-metal articles.

5 Claims, 1 Drawing Figure

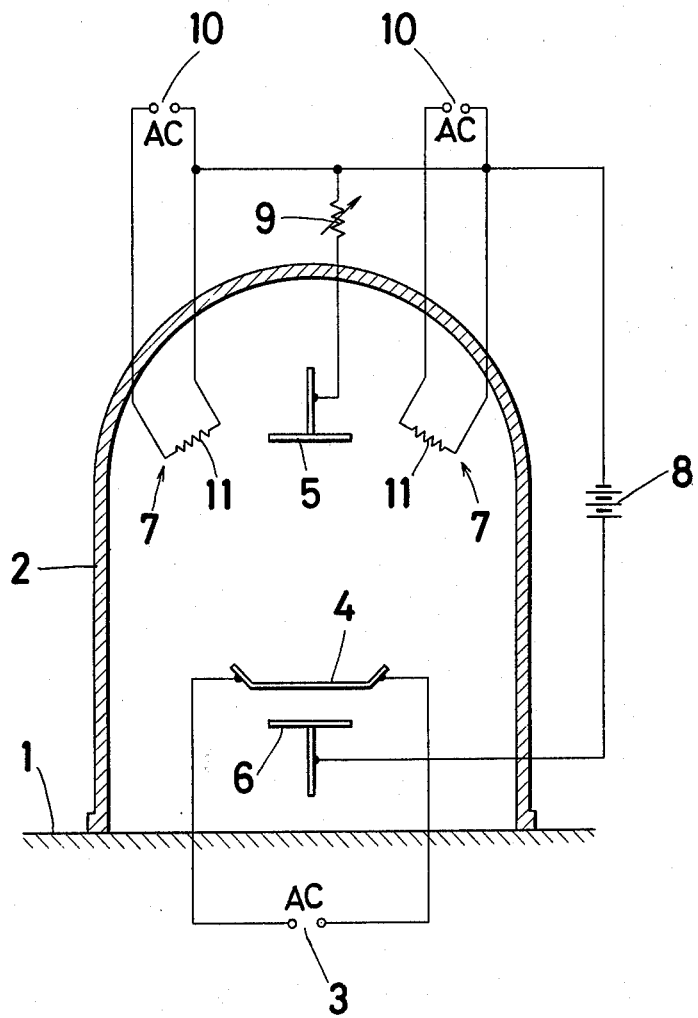

METHOD FOR IONIZATION ELECTROSTATIC PLATING

BACKGROUND OF THE INVENTION

This invention relates to an improved method for ionization electrostatic plating (ion plating) and to a device therefor.

It has heretofore been known that the plating of a given article with an electrostatic coating material is accomplished by causing glow discharge between a cathode which is the article subjected to plating and an anode which is the source of coating material, so that the coating material is vaporized and ionized to be deposited on the surface of the article. According to this method, the coating material deposited on the article is scattered because of the phenomenon of cathodic sputtering, causing the plating efficiency to be degraded seriously. Further, the ionization electric current and the sputtering action cooperate to heat the article serving as the cathode and elevate its temperature. Naturally the article subjected to plating is required to be maintained at a fixed temperature level while the coating material is being deposited on the article. When the temperature is too high, however, there ensue undesirable phenomena such as alteration of quality in the deposited coating material and also the substrate. To preclude such phenomena, the article must be maintained at a proper plating temperature during the plating operation. Said temperature elevation, however, interrelates with such factors as electric potential applied, electric current for ionization, pressure of rare gas and kind and shape of the article subjected to plating. The interrelation is such that an attempt to lower the temperature of the article subjected to plating entails a remarkable degradation of the ionization efficiency, for example. It is, therefore, impossible to lower the temperature alone without affecting other factors. It is similarly difficult to provide desired control of the ionization efficiency alone without affecting other factors.

When an article made of such non-metallic material as glass is mounted on the cathode and subjected to plating according to the aforementioned conventional method, the article is converted into a cathode because of the metallic film formed thereon during the initial stage of plating. Consequently, the original cathode and the newly formed cathode are electrically connected by the medium of the film to generate abnormal discharge, which obstructs ideal plating.

The primary object of this invention is to provide a highly efficient method for ionization electrostate plating wherein the temperature of the article subjected to plating can be controlled over a wide range so as to allow great freedom in the choice of coating conditions and permit coating of both metal and non-metal articles.

Another object of this invention is to provide a method for ionization electrostatic plating wherein the cathode is heated to promote emission of thermoelectrons thus promoting ionization and broadening the range of operable coating conditions.

Still another object of this invention is to provide an apparatus for working the above mentioned method.

SUMMARY OF THE INVENTION

This invention accomplishes the aformentioned objects by adopting a plating device wherein a cathode adapted to direct the flow of the vaporized coating material in the direction of an article subjected to plating is disposed separately of said article and an independent heating means is incorporated for exclusively heating the article subjected to plating, whereby the temperature of the article can be controlled so as to prevent possible straying of the film of deposited coating material due to the phenomenon of sputtering and, in the case of plating an article made of a non-metallic material, provide normal plating without entailing abnormal discharge.

This invention also aims to improve the plating efficiency by having the aforementioned cathode composed of a thermoelectron generating element, so that the cathode emits thermoelectrons required for controlling the ionization of rare gas and the vaporized coating material to be independent of the ionization efficiency and, at the same time, cause the coating material adhering to the cathode to be revaporized.

Other objects and other characteristics of the present invention will be explained in further detail hereinafter with reference to the accompanying drawing.

BRIEF EXPLANATION OF THE DRAWING

The drawing is a sectional view illustrating the outline of a preferred embodiment of the device according to the present invention.

DETAILED DESCRIPTION OF THE INVENTION

Referring to the drawing, a bell jar 2 is mounted on a base 1 to form a vacuum enclosure. The atmosphere inside this enclosure is composed of a rare gas such as argon having a degree of vacuum of the order of $10^{-2}$ to $10^{-3}$ torr. Inside this vacuum enclosure, a boat 4 connected to a power source 3 and containing a coating material is disposed and an article 5 desired to be plated is placed opposite the boat 4. An anode 6 adapted to produce glow discharge inside the enclosure is disposed close to the boat 4 or the boat 4 itself is used as a makeshift anode. A single cathode 7, or a plurality of cathodes, formed of a thermoelectron generating element 11 such as of tungsten filaments is disposed around the article subjected to plating separately of said article. The two electrodes described above are connected to a power source 8 so as to produce glow discharge upon application of necessary electric potential between the electrodes. A variable resistor 9 is inserted in the circuit interconnecting the article 5 subjected to plating and its power source 8 so as to permit control of the heating temperature of the article 5. This variable resistor 9 enables the operator to regulate the electric current flowing to the article 5 to a magnitude necessary for heating the article to a proper plating temperature.

In a device of such construction as described above, the coating material in the boat 4 is vaporized by heating and at the same time an electric potential is applied between the two electrodes 6 and 7 to induce glow discharge, with the result that the vaporized coating material is ionized and drawn out by virtue of the cathode. Said article 5 desired to be plated is placed at the optimum position within the path of a plasma formed of the ionized vapor of coating material, so that the coating material efficiently lands to be deposited on the surface of the article.

During this plating operation, it is a requirement that the article subjected to plating is heated to and maintained at a proper temperature. This heating of the article is effected by a suitable independent heating means so that the temperature of the article remains unaffected by the ionization current flowing between the two electrodes 6 and 7. The temperature of the article subjected to plating is controlled as required by regulating said heating means. This heating can also be effected by applying to the article 5 an electric potential regulated by the variable resistor 9 so as to permit flow of an ionization current required for maintaining the article at a suitable temperature. In this case, it is important that the ionized vapor of coating material should be accelerated solely by means of the cathode 7 while the ionization current flowing to the article subjected to plating should be limited to the level necessary only for the heating of the article. Only when this requirement is satisfied, the temperature of the article subjected to plating can be controlled without reference to the ionization current flowing through the cathode and the device itself can be simplified. Thus, the article subjected to plating is kept free from the electric potential which is applied for the predominant purpose of glow discharge. This freedom of the article from the application of said electric potential also proves to be effective in preventing the deposited coating material from being scattered because of the phenomenon of cathodic sputtering.

The ionization of the vaporized coating material can be accelerated by having said cathode 7 formed of a thermoelectron generating element 11 such as of tungsten filaments connected to a power source 10 and irradiating the vaporized coating material with the thermoelectrons generated from the element 11. In the case of the conventional method, such factors as ionization efficiency and temperature of the article subjected to plating are interrelated and, therefore, cannot be controlled independently of each other. According to the method just described, it is possible to have the ionization efficiency controlled independently by the adjustment of the power source 10. Since the cathode is heated to a high temperature, the coating material which is about to be deposited thereon can be rescattered, with the result that wasteful adhesion of the coating material on the cathode is prevented.

As described in detail above, the plating method of this invention permits the temperature of the article subjected to plating and the efficiency of ionization to be controlled independently of each other, so that the coating material can be efficiently deposited on the article subjected to plating, no matter whether the article is of a metallic or non-metallic material. Consequently, the vaporized coating material which has already been deposited on the article can be prevented from being scattered owing to the phenomenon of cathodic sputtering and possible adhesion of the vaporized coating material to the cathode can be precluded.

What is claimed is:

1. In an ionization electrostatic plating method wherein glow discharge is generated in a closed atmosphere of a rare gas containing therein a coating material and an article subjected to plating and said coating material is vaporized so that the vaporized coating material is ionized and accelerated to be deposited on the article subjected to plating, the improvement therein comprising having a cathode disposed adjacent but separate from said article subjected to plating, effecting the acceleration of the ionized vapor of coating material by means of said cathode and controlling the ionization current flowing to said article subjected to plating to a level such that it will heat the article to a temperature necessary for plating and will not cause the article to function as a principal cathode.

2. A method according to claim 1, wherein an electric potential applied between the article subjected to plating and the anode disposed in the atmosphere of the rare gas is adjusted so that the amount of the ionization current flowing to the article subjected to plating will be enough to heat the article to a temperature necessary for plating.

3. A method according to claim 1, wherein the cathode is composed of a thermoelectron generating element so that the thermoelectrons radiated by the cathode are utilized for accelerating the ionization of rare gas and the vaporized coating material and at the same time causing the coating material adhering to the cathode to be vaporized.

4. A method according to claim 3, wherein the thermoelectron generating element constituting the cathode is made of tungsten filaments.

5. A method according to claim 1 wherein the closed atmosphere has a degree of vacuum of the order of $10^{-2}$ to $10^{-3}$ torr.

* * * * *